(12) United States Patent
Wang et al.

(10) Patent No.: US 10,825,960 B2
(45) Date of Patent: Nov. 3, 2020

(54) SINGLE-SIDED LIGHT-EMITTING LED CHIPS AND FABRICATION METHOD THEREOF

(71) Applicants: Jiangxi Litkconn Optics Institute Technology Co., LTD, Jiangxi (CN); Shenzhen NiceUV Optics Co., Ltd., Guangdong (CN)

(72) Inventors: Liangchen Wang, Jiangxi (CN); Zhaozhong Liu, Jiangxi (CN); Wenxin Lan, Jiangxi (CN); Hui Lin, Jiangxi (CN)

(73) Assignees: Jiangxi Litkconn Optics Institute Technology Co., LTD, Ganzhou (CN); Shenzhen NiceUV Optics Co., Ltd., Shenzhen (CN)

( * ) Notice: Subject to any disclaimer, the term of this patent is extended or adjusted under 35 U.S.C. 154(b) by 0 days.

(21) Appl. No.: 16/508,241

(22) Filed: Jul. 10, 2019

(65) Prior Publication Data

US 2020/0020832 A1    Jan. 16, 2020

(30) Foreign Application Priority Data

Jul. 10, 2018  (CN) .......................... 2018 1 0751731

(51) Int. Cl.
*H01L 33/46* (2010.01)
*H01L 33/06* (2010.01)
*H01L 33/56* (2010.01)

(52) U.S. Cl.
CPC .............. *H01L 33/46* (2013.01); *H01L 33/06* (2013.01); *H01L 33/56* (2013.01); *H01L 2933/005* (2013.01); *H01L 2933/0025* (2013.01)

(58) Field of Classification Search
None
See application file for complete search history.

(56) References Cited

U.S. PATENT DOCUMENTS

2014/0239318 A1*  8/2014  Oyu ........................ H01L 24/82
                                                                257/88
2015/0316215 A1*  11/2015  Togawa ................ H01L 33/505
                                                                362/231

FOREIGN PATENT DOCUMENTS

CN       106505136 A       3/2017
CN       108269885 A       7/2018

* cited by examiner

*Primary Examiner* — Cheung Lee
(74) *Attorney, Agent, or Firm* — Wayne & Ken, LLC; Tony Hom

(57) ABSTRACT

Provided are a single-sided light-emitting LED chip and a fabrication method thereof. The single-sided light-emitting LED chip includes a highly reflective dielectric film and an LED including a substrate layer, an epitaxial layer, a cathode, and an anode. The LED has a substrate side, that is one surface of the substrate layer, and an electrode side opposite to each other, and the four sidewalls that respectively contacts the substrate side and the electrode side. The epitaxial layer is located on the other surface of the substrate layer; the cathode and the anode are located on a side of the epitaxial layer away from the substrate layer; and the four sidewalls of the LED are covered with the highly reflective dielectric film. The present invention simplifies the packaging process and improves the luminous efficiency of the packaged chip.

10 Claims, 4 Drawing Sheets

SINGLE-SIDED LIGHT-EMITTING LED CHIPS AND FABRICATION METHOD THEREOF

CROSS-REFERENCE TO RELATED APPLICATIONS

This application claims the benefit of priority from Chinese Patent Application No. 201810751731.8, filed on Jul. 10, 2018. The content of the aforementioned application, including any intervening amendments thereto, is incorporated herein by reference in its entirety.

TECHNICAL FIELD

The present invention relates to LED chips, more particularly to a single-sided light-emitting LED chip and a fabrication method thereof.

BACKGROUND OF THE INVENTION

At present, the LED-based lighting industry is in an extensive and innovative development, with general lighting transforming into intelligent lighting and beyond lighting in accordance with a wide range of applications and special needs. This has extended to various fields such as industry, agricultural breeding, medical using optics, backlight display, optical communication, intelligent lighting and security.

Diversity demands for the light quality and structure of LED chips come with the purpose of meeting different markets. For example, in the automobile industry, LED chips have begun to replace traditional vehicle headlights, in addition to low-power display and lighting, which sets new demands for the LED chip and the thermal management system thereof. In the prior art, in order to have desirable light shape high optical density and illumination in long-distance projection for the equipment such as automobile headlights, four sidewalls of the LED chip are usually encapsulated with milky white encapsulant during the packaging of a plurality of five-sided light-emitting LED dies or CSP chips, so that the light can only escape from the light-emitting side, so the single-sided light-emitting integrated chip and CSP chip are formed.

However, some of the light is unnecessarily absorbed by the milky white encapsulant covering the four sidewalls, so the luminous efficiency of the single-sided light-emitting integrated chip and the CSP chip using the technique mentioned above is reduced. Thereby, there is a need to provide a single-sided light-emitting LED chip and a fabrication method thereof to improve the luminous efficiency of the integrated chip and the CSP chip.

SUMMARY OF THE INVENTION

A single-sided light-emitting LED chip and a fabrication method thereof are provided in the present invention, which solves the problem of luminous efficiency reduction of the single-sided light-emitting integrated LED chip and the CSP chip using encapsulant.

A single-sided light-emitting LED chip comprises:
an LED, comprising a substrate layer, an epitaxial layer, a cathode, and an anode; and
a highly reflective dielectric film;

The LED has a substrate side and an electrode side opposite to each other, and four sidewalls; one surface of the substrate layer is the substrate side, and the epitaxial layer is located on the other surface of the substrate layer; and the cathode and the anode are located on a side of the epitaxial layer away from the substrate layer; and the four sidewalls of the LED are each covered with a highly reflective dielectric film.

Further, when the LED chip is of a conventional structure, a light-emitting side is the electrode side of the LED chip, and the substrate side of the LED chip is deposited with a highly reflective layer, so that five sides of the LED chip are encapsulated with the highly reflective film; when the LED chip is of a flip-chip structure, the light-emitting side is the substrate side of the LED chip; the highly reflective layer is provided on the electrode side of the epitaxial layer away from the substrate layer, such that five sides of the LED chip are encapsulated with the highly reflective film.

Further, when the LED chip is of the conventional structure, the highly reflective layer deposited on the substrate side of the LED chip is a first highly reflective dielectric layer; when the LED chip is of the flip-chip structure, the highly reflective layer is a metal highly reflective layer, or the highly reflective layer comprises a conductive film layer and a second highly reflective dielectric layer, and the conductive film layer is covered with the second highly reflective dielectric layer.

Further, the substrate layer is a sapphire substrate, and the epitaxial layer comprises an N-type semiconductor layer, a quantum well region and a P-type semiconductor layer; the N-type semiconductor layer is located on a side of the substrate layer away from the substrate side; the quantum well region is located on a side of the N-type semiconductor layer away from the substrate layer; the P-type semiconductor layer is located on a side of the quantum well region away from the substrate layer; the P-electrode located on a side of the P-type semiconductor layer away from the substrate layer is connected to the P-type semiconductor layer; and the N-electrode located on the side of the N-type semiconductor layer away from the substrate layer is connected to the N-type semiconductor layer.

Further, the highly reflective dielectric film has a reflectivity of more than 90%, and comprises a plurality of silicon oxide films and a plurality of titanium oxide films.

Further, the LED chip is a blue LED chip.

In order to solve the technical problems mentioned above, the present invention further provides a fabrication method for any of the single-sided light-emitting LED chips, which comprises encapsulating the four sidewalls of the LED with the highly reflective dielectric film using dielectric film evaporation.

Further, for the conventional LED chip, taking the electrode side of the LED chip and four sidewalls of the LED as a light-emitting side, the highly reflective layer is deposited onto the substrate side of the LED chip before encapsulating the LED with the highly reflective dielectric film. For the flip-chip LED chip, taking the substrate side of the LED chip and the four sidewalls of the LED as a light-emitting side, the highly reflective layer is provided onto a side of an epitaxial layer away from a substrate layer before encapsulating the LED with the highly reflective dielectric film.

Further, the encapsulating the four sidewalls of the LED with the highly reflective dielectric film using dielectric film evaporation comprises:
when fabricating the conventional LED chip, cutting a conventional LED wafer into a plurality of LED dies; arranging the plurality of LED dies at a predetermined spacing on a first tacky surface of a high temperature film with two tacky surfaces, where the electrode side is stuck on the first tacky surface; sticking the second tacky surface of the high temperature film, stuck with the LED dies, onto a support plate surface of a convex slide chuck of an electron beam deposition device; carrying out an evaporation of the highly reflective dielectric film on each of the plurality of LED dies in a vacuum deposition device; removing the high temperature film stuck with the LED dies from the support plate surface of the convex slide chuck of the electron beam deposition device; turning the LED dies onto a flexible tacky film by a film-flipping method, so that the electrode side of the conventional LED chip faces upward.

Further, when fabricating the flip-chip LED chip, comprising the following steps: cutting a flip-chip LED wafer covered with a sacrificial film into a plurality of LED dies; arranging the plurality of LED dies according to a predetermined spacing on a first tacky surface of a high temperature film with two tacky surfaces, where the electrode side is stuck on the first tacky surface; sticking the second tacky surface of the high temperature film, stuck with the LED dies, onto the support plate surface of a convex slide chuck of an electron beam deposition device; carrying out the evaporation of the highly reflective dielectric film on each of the plurality of LED dies in the vacuum deposition device; removing the high temperature film stuck with the LED dies from the support plate surface of the convex slide chuck of the electron beam deposition device; removing the sacrificial film and the highly reflective dielectric film thereon by the flexible tacky film using the film-flipping method, so that the substrate side of the flip-chip LED chip faces upward.

In addition, any of the single-sided light-emitting LED chips of the present invention can be packaged as a single-sided light-emitting integrated LED chip or a single-sided light-emitting CSP LED chip.

Compared with the prior art, the single-sided light-emitting LED chip and the fabrication method thereof provided in the invention have the following beneficial effects.

The single side light emission is realized by encapsulating the four sidewalls of the LED chip with the highly reflective dielectric film, which completely differs from the single-sided light-emitting integrated chip relied on the milky white encapsulant. So that the complicated packaging process is greatly simplified, and the luminous efficiency and the optical density of the single-sided light emitting LED chip is effectively improved, and the light shape in the long-distance projection is improved, which better meets the needs of the market for automobiles, flash lights and high mast lamp, etc.

The exemplary embodiments of the present invention will be described in detail with reference to the accompanying drawings, from which other features and advantages of the present invention will become more apparent.

BRIEF DESCRIPTION OF THE DRAWINGS

The accompanying drawings, which are incorporated in and formed a part of the specification, illustrate embodiments of the present invention and, together with the descriptions of the drawings, are used to explain the principles of the present invention.

DETAILED DESCRIPTION OF EMBODIMENTS

Figure 1:
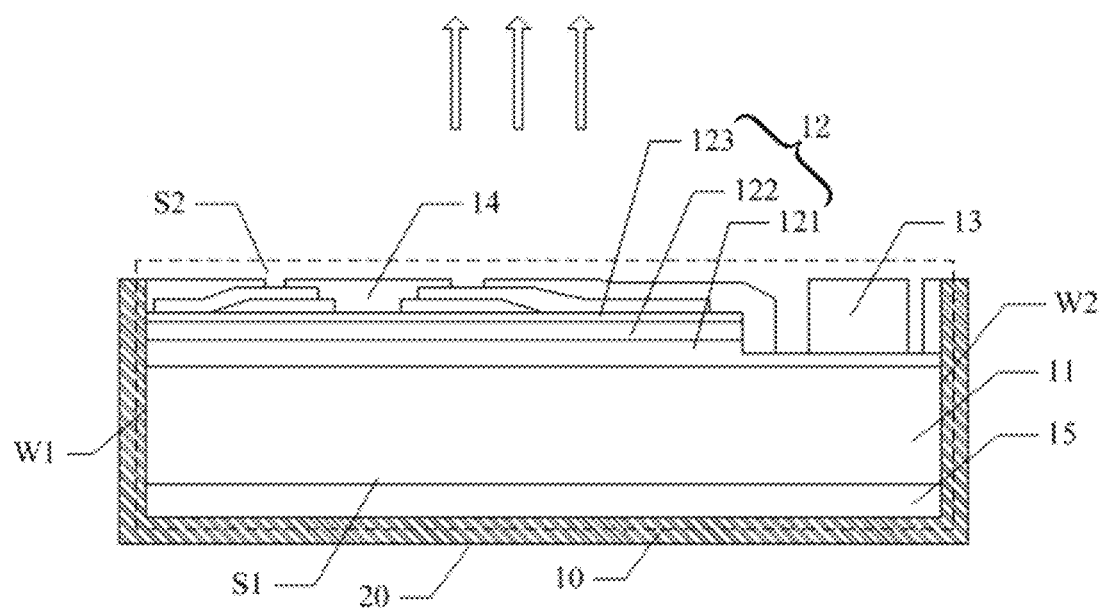
FIG. 1 is a schematic view of a single-sided light-emitting LED chip according to a first embodiment of the present invention.

Various exemplary embodiments of the present invention will now be described in detail with reference to the accompanying drawings. It should be noted that the relative arrangement of the components and steps, numerical expressions and numerical values set forth in the embodiments are not intended to limit the scope of the present invention unless otherwise specified.

The following description of at least one exemplary embodiment is merely illustrative and is not intended to limit the present invention and its application or use.

Techniques, methods and apparatus known to the skilled in the relevant art may not be discussed herein in detail. However, in appropriate circumstances, the techniques, methods and apparatus should be considered as a part of the specification.

For all of the examples shown and discussed herein, any specific values are to be construed as illustrative only but not as limiting. Thus, other examples of the exemplary embodiments may have different values.

It should be noted that similar reference numerals and letters indicate similar items in the accompanying drawings, therefore, once an item is defined in one figure, it is not required to be further discussed in subsequent figures.

In order to improve the luminous efficiency of the integrated chip and the CSP chip, the inventors conducted the following research of the integrated chip and the CSP chip in the prior art. Although single side light emission of the integrated chip and the CSP chip are realized through the milky white encapsulant in the prior art, about 15% of the light generated by the LED chip is absorbed by the milky white encapsulant, which seriously reduces the luminous efficiency of the LED chip packaged as the integrated chip and the CSP chip. Moreover, the difficulty of the packaging process is increased.

At the same time, the packaging process can only be used for the flip-chip LED chip to realize the single side light emission of the integrated chip and the CSP chip. For the conventional LED chip, the single side light emission of the integrated chip and the CSP chip cannot be realized by the packaging process in the prior art, which limits the application thereof.

On that account, the present invention proposes a new idea for forming a single-sided light-emitting integrated chip and a CSP chip, and specifically, a single-sided light-emitting LED is formed directly by the fabrication rather than the packaging. Specifically, a novel LED chip with single side light emission is realized by encapsulating four sidewalls of the LED with a dielectric film that is highly reflective (hereinafter referred to as a highly reflective dielectric film).

When the novel LED chip is used for forming the integrated chip and the CSP chip, the single side light emission is realized by the LED chip itself, and is no longer required to be completed during the packaging process, which greatly simplifies the complicated packaging process and avoids the light absorption of the encapsulant. Thereby the luminous efficiency of the single-sided light emitting LED chip is effectively improved, and the light shape in the long-distance projection is improved, which better meets the needs of the market for automobiles, flash lights and high mast lamps.

The embodiments of the single-sided light-emitting LED chip and the fabrication method thereof of the present invention will be described below.

Example 1

In this embodiment, a single-sided light-emitting LED chip of conventional structure is provided. FIG. 1 is a schematic view of the single-sided light-emitting LED chip according to embodiment 1 of the present invention.

As shown in FIG. 1, the single-sided light-emitting LED chip comprises:

an LED 10 comprising a substrate layer 11, an epitaxial layer 12, a cathode 13 and an anode 14; and a highly reflective dielectric film 20;

The LED 10 has a substrate side S1 and an electrode side S2 opposite to each other and four sidewalls. As shown in FIG. 1, a first sidewall W1 and a second sidewall W2 of the four sidewalls are shown; one surface of the substrate layer 11 is the substrate side S1, and the epitaxial layer 12 is located on the other surface of the substrate layer 11; the cathode 13 and the anode 14 are located on a side of the epitaxial layer 12 away from the substrate layer 11, that is, on the epitaxial layer 12; since the LED chip is of conventional structure, the electrode side S2 of the LED chip is the light-emitting side. The four sidewalls of the LED are covered with the highly reflective dielectric film 20. Preferably, the reflectivity of the highly reflective dielectric film 20 is set to be greater than 90% to enhance the luminous efficiency of the LED chip.

In this embodiment, the electrode side of the LED chip is the light-emitting side, and the other five sides (including the four sidewalls and the substrate side S1) are provided with highly reflective layers. In a case, the substrate side S1 of the LED chip is deposited with the highly reflective layer 15, which is preferably a highly reflective dielectric layer, defined as the first dielectric highly reflective layer in the embodiment. Only the four sidewalls of the LED 10 are covered with the highly reflective dielectric film 20, and the reflection of the substrate side S1 of the LED is realized by the highly reflective layer 15. Alternatively, the highly reflective layer 15, as well as the four sidewalls of the LED, are covered with the highly reflective dielectric film 20. In other cases, the substrate side S1 of the LED chip does not have the highly reflective layer 15 and, together with the four sidewalls of the LED, is covered with the highly reflective dielectric film 20. In any case, the five sides of the LED 10 are all encapsulated with the highly reflective dielectric film such that the light generated by the LED 10 can only escape from the electrode side, realizing the single side light emission of the LED chip.

Preferably, the LED chip is a blue LED chip, and the substrate layer 11 is a sapphire substrate. Accordingly, the highly reflective dielectric film 20 comprises a plurality of silicon oxide films and a plurality of titanium oxide films to obtain a reflectivity higher than 95% for the dominant wavelength of blue light emitted by the blue LED chips.

In an embodiment, the epitaxial layer 12 comprises an N-type semiconductor layer 121, a quantum well region 122, and a P-type semiconductor layer 123; the N-type semiconductor layer 121 is located on a side of the substrate layer 11 away from the substrate side S1; the quantum well region 122 is located on a side of the N-type semiconductor layer 121 away from the substrate layer 11; the P-semiconductor layer 123 is located on a side of the quantum well region 122 away from the substrate layer 11; the anode 14 located on a side of the P-type semiconductor layer 123 away from the substrate layer 11 is connected the P-type semiconductor layers 123, and the cathode 13 located on the side of the N-semiconductor layer 121 away from the substrate layer 11 is connected to the N-type semiconductor layer 121.

The single-sided light-emitting LED chip of the conventional structure in the embodiment is described above, and the fabrication method of the chip will be described in detail below.

The fabrication of any one of the single-sided light-emitting LED chips in the embodiment comprises the following step. The four sidewalls of the LED 10 are encapsulated with the highly reflective dielectric film 20 using the dielectric film evaporation.

Further, in a case, before the encapsulating of the highly reflective dielectric film 20, the method further comprises depositing the highly reflective layer 15 on the substrate side S1 of the LED. In the prior art, the substrate side S1 of the LED is usually deposited with the highly reflective layer 15 during the fabrication of the LED chip in order to emit light in the front. Therefore, in the embodiment, the highly reflective layer can still be deposited on the substrate side S1 without changing the existing process, further, for the highly reflective dielectric film, which can be grown on the four sidewalls of the LED 10 and/or a side of the highly reflective layer 15. In short, five sides of the LED are encapsulated with the highly reflective film.

Figure 2:
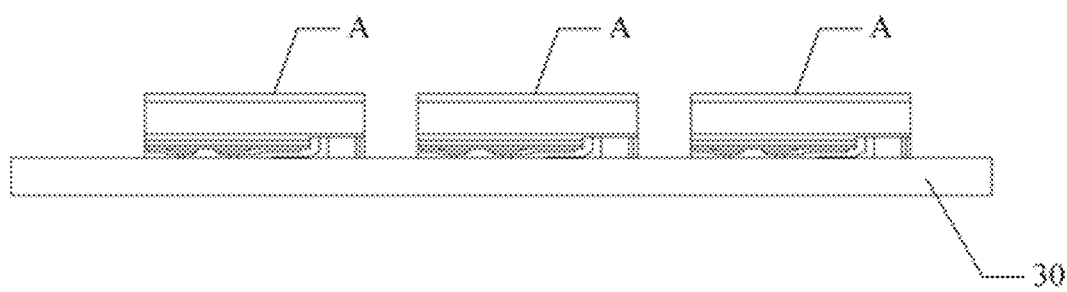
FIGS. 2-4 are schematic views showing the single-sided light-emitting LED chip of a conventional structure being manufactured.
Figure 3:
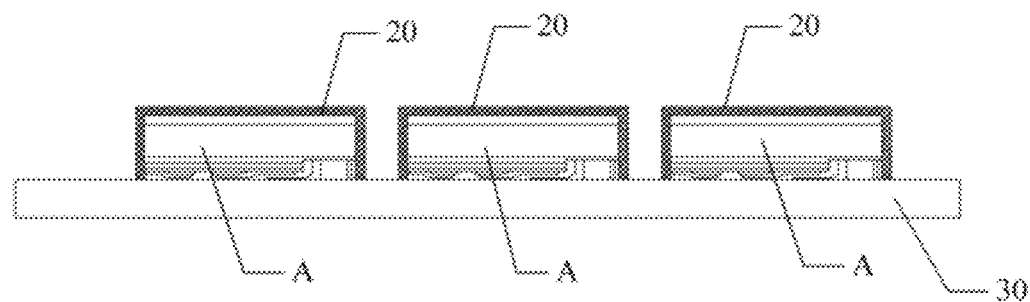
Figure 4:
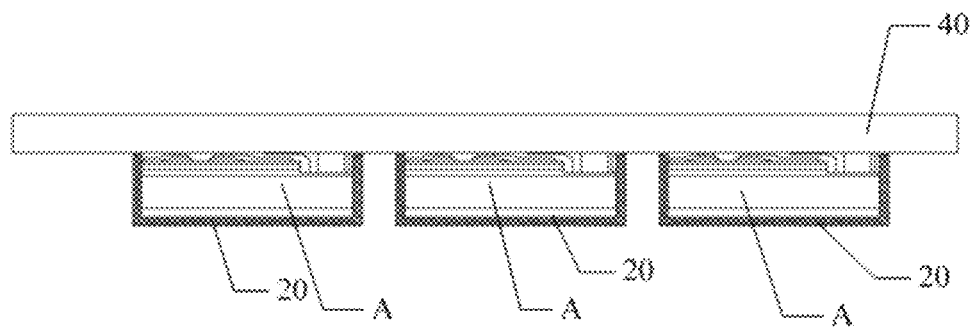

As shown in FIGS. 2-4, the four sidewalls of the LED 10 are encapsulated with the highly reflective dielectric film 20 using the dielectric film evaporation by a method comprising the following steps.

S11: The conventional LED wafer is cut into a plurality LED dies.

S12: The LED dies are arranged according to the predetermined spacing on a first tacky surface of a high temperature film 30 with two tacky surfaces.

As shown in FIGS. 1-2, the LED dies A are arranged on the high temperature film 30 at a certain spacing, and the electrode side S2 is stuck on the first tacky surface, and the substrate side S1 is deposited with the highly reflective layer 15, where the viscous failure temperature and the deformation temperature of the high temperature film 30 are above 200° C.

S13: The second tacky surface of the high temperature film 30, stuck with the LED dies, is stuck onto the support plate surface of a convex slide chuck of an electron beam deposition device.

S14: The evaporation of the highly reflective dielectric film on each of the LED dies is carried out in a vacuum deposition device.

S15: The high temperature film stuck with the LED dies is removed from the support plate surface of the convex slide chuck of the electron beam deposition device.

As shown in FIG. 3, the second tacky surface of the high temperature film 30, stuck with the LED dies, is evenly stuck onto the support plate surface of the convex slide chuck of an electron beam deposition device, and five sides (except the electrode side) of each LED die are covered with the highly reflective dielectric film 20 in the vacuum deposition device.

S16: The LED dies are turned onto a flexible tacky film by a film-flipping method, the electrode side of the conventional LED chip faces upward, and the top of the electrode side which emits light is exposed.

As shown in FIG. 4, the LED dies are turned onto the flexible tacky film 40 by the film-flipping method, and the electrode side (the light-emitting side) of the LED chip is exposed, and the single-sided light-emitting conventional LED chip is obtained.

Example 2

Figure 5:
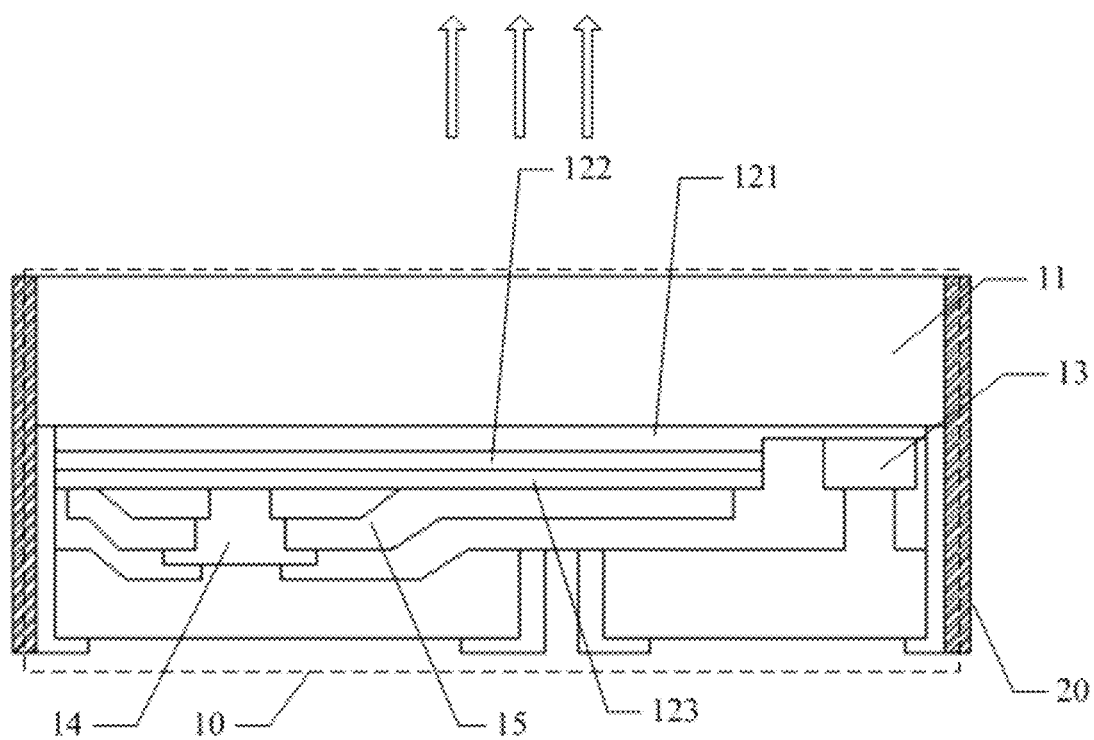
FIG. 5 is a schematic view of the single-sided light-emitting LED chip according to a second embodiment of the present invention.

In this embodiment, a single-sided light-emitting flip-chip LED chip is provided. FIG. 5 is a schematic view of the single-sided light-emitting LED chip according to embodiment 2 of the present invention.

As shown in FIG. 5, the single-sided light-emitting LED chip comprises:

an LED 10 comprising a substrate layer 11, an epitaxial layer 12, a cathode 13 and an anode 14; and a highly reflective dielectric film 20;

The LED 10 has a substrate side S1 and an electrode side S2 opposite to each other, and four sidewalls. FIG. 5 shows a first sidewall W1 and a second sidewall W2 of the four sidewalls; one surface of the substrate layer 11 is the substrate side S1, and the epitaxial layer 12 is located on the other surface of the substrate layer 11; the cathode 13 and the anode 14 are located on a side of the epitaxial layer 12 away from the substrate layer 11; since the LED chip is of the flip-chip structure, the substrate side S1 of the LED chip is the light-emitting side. The four sidewalls of the LED are covered with the highly reflective dielectric film 20. Preferably, the reflectivity of the highly reflective dielectric film 20 is set to be greater than 90% to enhance the luminous efficiency of the LED chip.

In this embodiment, the substrate side of the LED chip is the light-emitting side. At the same time, the side of the epitaxial layer 12 away from the substrate layer 11 is provided with the highly reflective layer 15, along with the four sidewalls of the LED 10 covered with the highly reflective dielectric film 20 such that the five sides of the LED are encapsulated with the highly reflective layer. In a case, as shown in FIG. 5, the highly reflective layer 15, set as the metal highly reflective layer, is located between the anode 14 and the epitaxial layer 12. In other cases, the highly reflective layer 15 comprises a conductive film layer and a highly reflective dielectric layer, which is defined as the second highly reflective dielectric layer, and the conductive film layer, located between the anode and the epitaxial layer 12, is covered with the second highly reflective dielectric layer. In any case, the five sides of the LED 10 are all encapsulated with the highly reflective film such that the light generated by the LED 10 can only escape from the substrate side, realizing the single side light emission of the flip-chip LED chip.

Preferably, the LED chip is a blue LED chip, and the substrate layer 11 is a sapphire substrate. Accordingly, the highly reflective dielectric film 20 comprises a plurality of silicon oxide films and a plurality of titanium oxide films to obtain a reflectivity higher than 95% for the dominant wavelength of blue light emitted by the blue LED chips.

In an embodiment, the epitaxial layer 12 comprises an N-type semiconductor layer 121, a quantum well region 122, and a P-type semiconductor layer 123, and the N-type semiconductor layer 121 is located on a side of the substrate layer 11 away from the substrate side S1; the quantum well region 122 is located on a side of the N-type semiconductor layer 121 away from the substrate layer 11; the P-semiconductor layer 123 is located on a side of the quantum well region 122 away from the substrate layer 11; the anode 14 located on the side of the P-type semiconductor layer 123 away from the substrate layer 11 is connected the P-type semiconductor layers 123; the cathode 13 located on the side of the N-semiconductor layer 121 away from the substrate layer 11 is connected to the N-type semiconductor layer 121.

The single-sided light-emitting LED chip of the flip-chip structure in the embodiment is described above, and the fabrication method of the chip will be described in detail below.

The fabrication of any one of the single-sided light-emitting LED chips in the embodiment comprises the following step. The four sidewalls of the LED 10 are encapsulated with the highly reflective dielectric film 20 using the dielectric film evaporation.

Further, in a case, before the encapsulating of the highly reflective dielectric film 20, the method further comprises depositing the highly reflective layer on the side of the epitaxial layer 12 away from the substrate layer 11, specifically, the highly reflective layer 15 can located at the metal highly reflective between the anode 14 and the epitaxial layer 12. Alternatively, the highly reflective layer 15 comprises a conductive film layer and a second highly reflective dielectric layer, and the conductive film layer is located between the anode 14 and the epitaxial layer 12, and the region of the conductive film layer that the anode is not disposed is covered with the second highly reflective dielectric layer.

Preferably, FIGS. 6-10 are schematic views of the single-sided light-emitting LED of the flip-chip structure. the four sidewalls of the LED 10 are encapsulated with the highly reflective dielectric film 20 using the dielectric film evaporation by a method comprising the following steps.

S21: The conventional LED wafer covered with a sacrificial film 50 is cut into a plurality LED dies.

Figure 6:
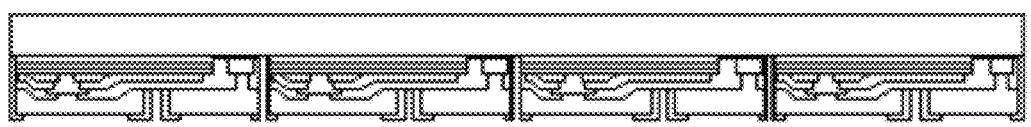
FIGS. 6-10 are schematic views showing the single-sided light-emitting LED chip of a flip-chip structure being manufactured.
Figure 7:
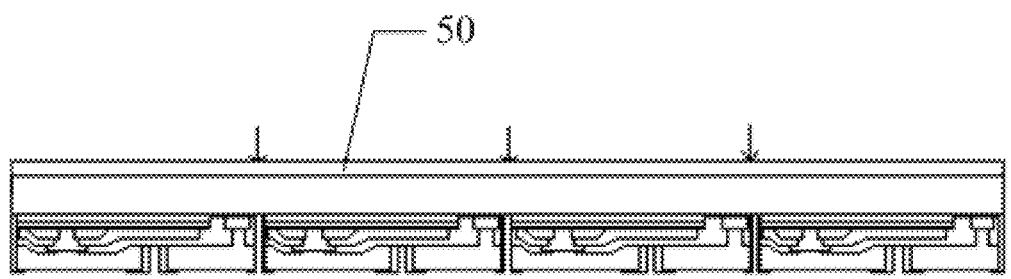

Referring to FIGS. 5 and 6, a fabricated flip-chip LED wafer is shown in FIG. 6. As shown in FIG. 7, the wafer covered with the sacrificial film 50 on the sapphire surface of the substrate side is cut into a plurality of LED dies B.

S22: The LED dies B are arranged according to the predetermined spacing on a first tacky surface of a high temperature film 30 with two tacky surfaces.

Figure 8:
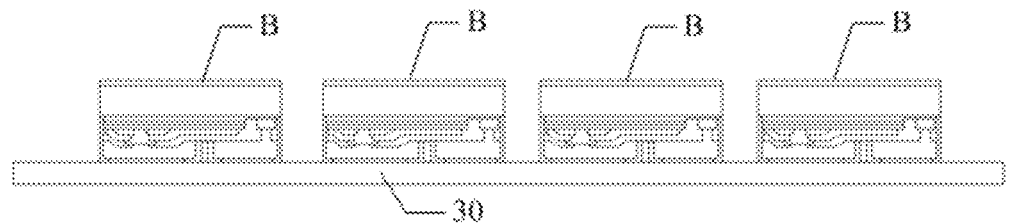

As shown in FIG. 8, the flip-chip LED dies B covered with the sacrificial film 50 are arranged on the high temperature film 30 at a certain spacing, and the electrode side of the LED die is stuck on the first tacky surface.

S23: The second tacky surface of the high temperature film 30, stuck with the LED dies B, is stuck onto the support plate surface of a convex slide chuck of an electron beam deposition device.

S24: The evaporation of the highly reflective dielectric film 20 on each of the LED die B is carried out in a vacuum deposition device.

Figure 9:
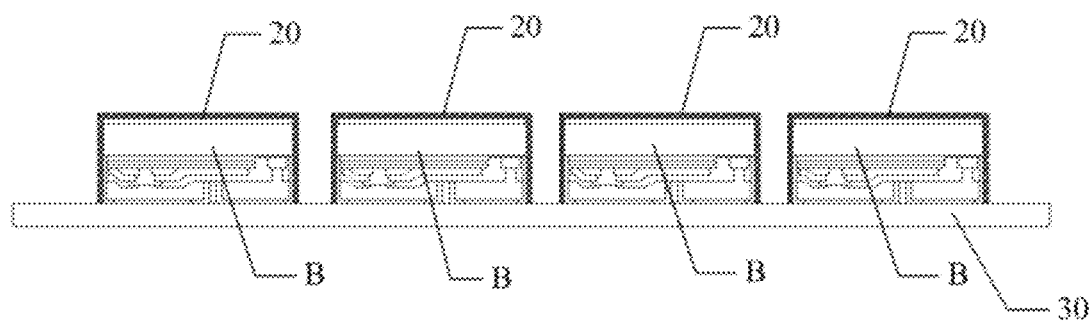

FIG. 9 is a schematic view showing an evaporation of the highly reflective dielectric film 20, in which outer surfaces of the LED dies B are encapsulated with the highly reflective dielectric film.

S25: The high temperature film 30 stuck with the LED dies B is removed from the support plate surface of the convex slide chuck of the electron beam deposition device.

S26: The sacrificial film 50 and the highly reflective dielectric film 20 thereon are removed with the flexible tacky film using the film-flipping method, so that the substrate side of the flip-chip LED faces upward.

Figure 10:
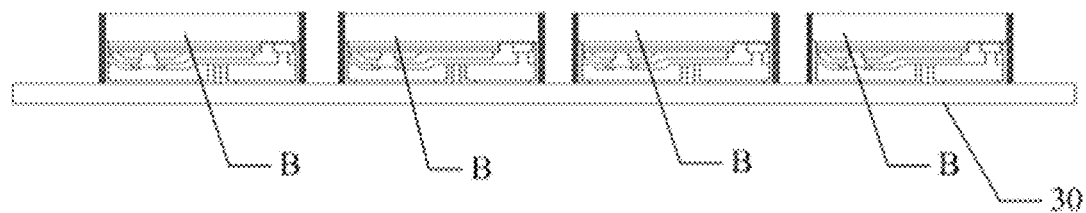

As shown in FIG. 10, the sacrificial film 50, covered with the highly reflective dielectric film, is removed from the sapphire surface by another tacky film, and the flip-chip blue LED chip with single side light emission is obtained.

Example 3

In this embodiment, a single-sided light-emitting LED integrated chip or a single-sided light-emitting CSP LED chip is provided. The single-sided light-emitting LED integrated chip or the single-sided light-emitting CSP LED chip are both formed by any of the single-sided light-emitting LED chips mentioned above. Comparing to the single-sided light-emitting LED integrated chip or CSP LED chip formed by the white encapsulant in the prior art, the single-sided light-emitting LED integrated chip or the single-sided light-emitting CSP LED chip in the embodiment has a better luminous efficiency. In addition, the single-sided light-emitting LED integrated chip or the single-sided light-emitting CSP LED chip can be formed base on either the conventional LED chip or the flip-chip LED chip.

Although the illustrated embodiments of the present invention have been described in detail, it should be understood by those skilled in the art that the above examples are merely illustrative but not intended to limit the scope of the present invention. It will be understood by those skilled in the art that the above embodiments may be modified without departing from the scope and spirit of the invention. The scope of the invention is defined by the appended claims.

We claim:

1. A single-sided light-emitting LED chip, comprising:
   an LED, comprising a substrate layer, an epitaxial layer, a cathode, and an anode; and
   a highly reflective dielectric film;
   wherein the LED has a substrate side and an electrode side opposite to each other, and four sidewalls; one surface of the substrate layer is the substrate side, and the epitaxial layer is located on the other surface of the substrate layer; and the cathode and the anode are located on a side of the epitaxial layer away from the substrate layer;
   the LED chip is of a conventional structure or a flip-chip structure; when the LED chip is of the conventional structure, a light-emitting side is the electrode side of the LED chip, and the substrate side of the LED chip is deposited with a highly reflective layer and the highly reflective dielectric film; and the four sidewalls of the LED chip is covered with the highly reflective dielectric film; and
   when the LED chip is of the flip-chip structure, the light-emitting side is the substrate side of the LED chip; the highly reflective layer is provided on the electrode side of the epitaxial layer away from the substrate layer and is provided between the anode and the epitaxial layer; the four sidewalls of the LED are covered with the highly reflective dielectric film such that five sides of the LED chip are encapsulated with the highly reflective film.

2. The LED chip of claim 1, wherein:
   when the LED chip is of the conventional structure, the highly reflective layer deposited on the substrate side of the LED chip is a first highly reflective dielectric layer;
   when the LED chip is of the flip-chip structure, the highly reflective layer is a metal highly reflective layer, or the highly reflective layer comprises a conductive film layer and a second highly reflective dielectric layer, and the conductive film layer is covered with the second highly reflective dielectric layer.

3. The LED chip of claim 2, the LED chip is a blue LED chip.

4. The LED chip of claim 1, wherein
   the substrate layer is a sapphire substrate;
   the epitaxial layer comprises an N-type semiconductor layer, a quantum well region and a P-type semiconductor layer;
   the N-type semiconductor layer is located on a side of the substrate layer away from the substrate side;
   the quantum well region is located on a side of the N-type semiconductor layer away from the substrate layer;
   the P-type semiconductor layer is located on a side of the quantum well region away from the substrate layer;
   the anode located on a side of the P-type semiconductor layer away from the substrate layer is connected to the P-type semiconductor layer; and
   the cathode located on the side of the N-type semiconductor layer away from the substrate layer is connected to the N-type semiconductor layer.

5. The LED chip of claim 4, the LED chip is a blue LED chip.

6. The LED chip of claim 1, wherein the highly reflective dielectric film has a reflectivity of more than 90%, and comprises multilayer silicon oxide films and multilayer titanium oxide films.

7. The LED chip of claim 6, the LED chip is a blue LED chip.

8. The LED chip of claim 1, the LED chip is a blue LED chip.

9. A method for fabricating a single-sided light-emitting LED chip, comprising fabricating a conventional LED chip or a flip-chip LED chip using dielectric film evaporation by a method comprising the following steps:
   for the conventional LED chip, taking an electrode side of the LED chip and four sidewalls of an LED as a light-emitting side, depositing a highly reflective layer and a highly reflective dielectric film on a substrate side of the LED chip, and encapsulating the four sidewalls of the LED with the highly reflective dielectric film; and
   for the flip-chip LED chip, taking a substrate side of the LED chip and four sidewalls of the LED as a light-emitting side; before the highly reflective dielectric film is encapsulated, providing the highly reflective layer on a side of an epitaxial layer away from a substrate layer and between the anode and the epitaxial layer;
   wherein encapsulating the four sidewalls of the LED with the highly reflective dielectric film using dielectric film evaporation comprises:
   when fabricating the LED chip of the conventional structure,
   cutting a conventional LED wafer into a plurality of LED dies;
   arranging the plurality of LED dies according to a predetermined spacing on a first tacky surface of a high temperature film with two tacky surfaces, wherein the electrode side is stuck on the first tacky surface;
   sticking a second tacky surface of the high temperature film, stuck with the LED dies, onto a support plate surface of a convex slide chuck of an electron beam deposition device;
   carrying out an evaporation of the highly reflective dielectric film on each of the plurality of LED dies in a vacuum deposition device;
   removing the high temperature film stuck with the LED dies from the support plate surface of the convex slide chuck of the electron beam deposition device;
   turning the LED dies onto a flexible tacky film by a film-flipping method, so that the electrode side of the conventional LED chip faces upward; and
   when fabricating the LED chip of the flip-chip structure, cutting the flip-chip LED wafer covered with a sacrificial film into a plurality of LED dies;

arranging the plurality of LED dies according to a predetermined spacing on a first tacky surface of a high temperature film with two tacky surfaces, wherein the electrode side is stuck on the first tacky surface;

sticking the second tacky surface of the high temperature film, stuck with the LED dies, onto a support plate surface of a convex slide chuck of an electron beam deposition device;

carrying out the evaporation of the highly reflective dielectric film on each of the plurality of LED dies in the vacuum deposition device;

removing the high temperature film stuck with the LED dies from the support plate surface of the convex slide chuck of the electron beam deposition device; and removing the sacrificial film and the highly reflective dielectric film thereon by the flexible tacky film using the film-flipping method, so that the substrate side of the flip-chip LED chip faces upward.

10. The method of claim 9, further comprising: encapsulating the single-sided light-emitting LED chip using a packaging technique to form a single-sided light-emitting integrated LED chip or a single-sided light-emitting CSP LED chip.

* * * * *